(12) United States Patent
Yan et al.

(10) Patent No.: US 11,726,145 B2
(45) Date of Patent: Aug. 15, 2023

(54) TRANSFORMER MONITORING APPARATUS AND METHOD BASED ON NON-ELECTRICITY COMPREHENSIVE CHARACTERISTIC INFORMATION

(71) Applicant: BEIJING ZHONGRUIHE ELECTRICAL CO., LTD, Beijing (CN)

(72) Inventors: Chenguang Yan, Shaanxi (CN); Shuyou Zhu, Beijing (CN); Che Xu, Shaanxi (CN); Baofeng Luo, Beijing (CN); Baohui Zhang, Shaanxi (CN); Yan Gao, Beijing (CN); Hao Liu, Shaanxi (CN); Xianwu Zhou, Beijing (CN)

(73) Assignee: BEIJING ZHONGRUTHE ELECTRICAL CO., LTD, Beijing (CN)

( * ) Notice: Subject to any disclaimer, the term of this patent is extended or adjusted under 35 U.S.C. 154(b) by 84 days.

(21) Appl. No.: 17/519,598

(22) Filed: Nov. 5, 2021

(65) Prior Publication Data
US 2022/0057458 A1  Feb. 24, 2022

Related U.S. Application Data

(63) Continuation of application No. PCT/CN2020/088453, filed on Apr. 30, 2020.

(30) Foreign Application Priority Data

May 7, 2019  (CN) .......................... 201910375858.9

(51) Int. Cl.
*G01R 31/62* (2020.01)
*G01F 1/66* (2022.01)
*G01L 19/08* (2006.01)

(52) U.S. Cl.
CPC ............... *G01R 31/62* (2020.01); *G01F 1/66* (2013.01); *G01L 19/086* (2013.01)

(58) Field of Classification Search
CPC ......... G01R 31/62; G01F 1/66; G01L 19/086; G01D 21/02
See application file for complete search history.

(56) References Cited

U.S. PATENT DOCUMENTS

2017/0274419 A1* 9/2017 Frimpong ............... G01S 3/808
2022/0221528 A1* 7/2022 Wang ..................... G01R 31/62

FOREIGN PATENT DOCUMENTS

CN  202817913 U  3/2013
CN  203490023 U  3/2014
(Continued)

*Primary Examiner* — Manuel A Rivera Vargas
*Assistant Examiner* — Yaritza H Perez Bermudez

(57) ABSTRACT

A transformer monitoring apparatus based on non-electricity comprehensive characteristic information includes a transient oil pressure characteristic measuring module, a transient oil flow characteristic measuring module, a transient acceleration characteristic measuring module, a signal conditioning and acquiring module, and a digital processing and analyzing module; the transient oil pressure characteristic measuring module, the transient oil flow characteristic measuring module, and the transient acceleration characteristic measuring module are each connected to the signal conditioning and acquiring module, and the signal conditioning and acquiring module is connected to the digital processing and analyzing module. A transformer monitoring method based on non-electricity comprehensive characteristic information is also provided. The apparatus and method calculate an operating oil pressure, an operating oil flow, and an operating acceleration, which characterize a running state of the transformer, by comprehensively using information of a plurality of non-electricity transient characteristics in the transformer.

10 Claims, 6 Drawing Sheets

(56) References Cited

FOREIGN PATENT DOCUMENTS

| | | | |
|---|---|---|---|
| CN | 104362736 A | * | 2/2015 |
| CN | 104362736 A | | 2/2015 |
| CN | 104614018 A | | 5/2015 |
| CN | 105301281 A | * | 2/2016 |
| CN | 105301281 A | | 2/2016 |
| CN | 106404078 A | | 2/2017 |
| CN | 206038058 U | | 3/2017 |
| CN | 207067271 U | | 3/2018 |
| CN | 208206204 U | | 12/2018 |
| CN | 208254542 U | | 12/2018 |
| CN | 110018328 A | | 7/2019 |
| CN | 110057443 A | | 7/2019 |
| CN | 110174137 A | | 8/2019 |
| CN | 209605874 U | | 11/2019 |
| JP | H08136597 A | | 5/1996 |
| MX | 2014015007 A | | 5/2016 |

* cited by examiner

TRANSFORMER MONITORING APPARATUS AND METHOD BASED ON NON-ELECTRICITY COMPREHENSIVE CHARACTERISTIC INFORMATION

CROSS-REFERENCE TO RELATED APPLICATIONS

The present application is a continuation of International Application No. PCT/CN2020/088453 filed on Apr. 30, 2020, which claims priority to Chinese patent application No. 201910375858.9 filed on May 7, 2019, the entire contents of which are incorporated herein by reference.

TECHNICAL FIELD

The present disclosure relates to the field of power systems, and more particularly, to a transformer monitoring apparatus and a transformer monitoring method based on non-electricity comprehensive characteristic information, which are used for measuring, recording and analyzing non-electricity information such as transient oil pressure, oil flow, acceleration and the like in an oil-immersed power transformer, for realizing real-time monitoring of the power transformer and reliable evaluation of a running state of the power transformer.

BACKGROUND

As a key electric power main device, a transformer plays a crucial role in an electric power system, and the stable operation of the transformer is an important premise for ensuring the reliable transmission, flexible distribution and safe use of electric energy of the whole electric power system. Especially, a large-size power transformer installed at the system hub has high voltage level, large capacity, complex structure and high cost, so that once a fault occurs, the power supply reliability and the operation stability of the electric power system are seriously affected, and huge economic loss is caused by the damage of the fault.

The transformer oil as the petroleum extract has the advantages of good insulating property, lower viscosity, good heat transfer property, low manufacturing cost and the like. Since the end of the $19^{th}$ century, power transformers began to be filled with such paraffinic heavy oils for use as cooling and insulating media. Except for some medium and small-capacity transformers with special purposes and individual gas-insulated transformers, oil-immersed transformers using a transformer oil as a filler are widely applied to power systems with different capacity and voltage grade requirements.

In the operation process of the oil-immersed power transformer, the running state of the oil-immersed power transformer is closely associated with non-electricity characteristics such as oil pressure in an oil tank, oil flow, and body acceleration, and the monitoring and evaluation of the running state and the health condition of the transformer can be realized by measuring, calculating and analyzing the non-electricity characteristics.

First, for the internal oil pressure characteristics of the transformer, when severe overheating or arc fault occurs inside the oil-immersed power transformer, the liquid insulating oil is instantly vaporized and decomposed to form high-energy-content bubbles of a certain volume. Under the continuous injection of fault electric energy, the internal pressure of a fault bubble is continuously increased, and meanwhile, because the liquid insulating oil near a fault point has expansion inertia, a gas-liquid phase interface between the fault bubble and the surrounding liquid insulating oil inevitably generates significantly increased pressure, which transmits in the oil tank of the transformer in the form of pressure waves, resulting in integral sudden increase of the oil pressure in the oil tank. When an overheat fault occurs inside the transformer, the rise in the temperature of the insulating oil also causes a change in the oil pressure of the insulating oil. On the other hand, when the transformer has an external short-circuit fault, the fault point is located at the outlet of the transformer, and the influence on the internal pressure of the oil tank is only reflected by the vibration of a winding caused by the short-circuit through current. Moreover, the process causes limited oil pressure changes, since the mechanical strain of the winding will consume a lot of energy. Similar to the external fault, the normal operation of the transformer and the magnetizing inrush current are all caused by vibration generated by current flowing through the winding to cause oil pressure changes. Therefore, real-time measurement, recording, calculation and analysis of the oil pressure in the oil tank of the transformer have important reference value for the transformer operation and maintenance personnel to evaluate the safe running state of the transformer.

Secondly, for the internal oil flow characteristics of the transformer, when the transformer normally operates, the following two main reasons cause the internal oil flow of the transformer: natural convection of the transformer oil generated due to a temperature difference and circulation of the transformer oil forced by a cooling system oil pump. When the transformer has an internal short-circuit fault, under the combined action of heating and ionization of the fault electric arc, a large amount of insulating oil near a fault point is vaporized and decomposed to form compressed bubbles of a certain volume. The expansion of the volume of the fault bubbles forces a part of insulating oil to surge towards an oil conservator of the transformer, and meanwhile, the fault bubbles form a continuous gas-liquid two-phase flow to rush into a connecting pipe at the top of the oil tank in the processes of floating upwards and splitting. Therefore, under the condition of an internal short-circuit fault, the oil flow characteristics inside the oil tank of the transformer will change significantly, and especially the internal oil flow surging characteristics of a connecting pipe between the main oil tank and the oil conservator are more significant. When the transformer is short-circuited externally, the deformation and vibration of the winding and the internal metal components caused by the short-circuit fault current passing through the winding are the main reasons for the change of oil flow. Because the whole internal structure of the transformer is completely immersed in the insulating oil of the transformer, a relative displacement of a solid-liquid phase interface is inevitably caused by the vibration of components such as the winding under the impact of external short-circuit current, and the significant change of an internal flow field of the oil tank is caused. Therefore, the in-time measurement, recording, calculation and analysis of the oil flow in the transformer conservator connecting pipe have important reference value for transformer operation and maintenance personnel to obtain transient oil flow characteristics in the transformer conservator connecting pipe and evaluate the safe running state of the transformer.

Thirdly, for the acceleration characteristics of the body of the transformer, when an internal fault occurs in the oil-immersed power transformer, the insulating oil at the fault point is instantly vaporized to form oil vapor bubbles due to the generation of electric arcs, the pressure in the bubbles is sharply increased with the continuation of the fault due to the expansion inertia of the surrounding insulating oil, and the generated pressure wave is transmitted through refraction and reflection of the internal components of the transformer to cause the sudden rise of the internal pressure of the oil tank and the structural deformation and vibration of the body of the transformer. Since it is difficult to obtain the transient strain characteristics of the body of the transformer, the deformation or damage degree of the transformer can be evaluated by monitoring the vibration acceleration characteristics of the body of the transformer in real time. In addition, because the transformer core and the winding are physically connected to the body, the vibration characteristics of the core and the winding are also reflected by the acceleration characteristics of the body. The real-time measurement, recording, calculation and analysis of the acceleration of the body of the transformer have important reference value for the operation and maintenance personnel of the transformer to evaluate the safe running state of the body of the transformer, the iron core and the winding.

In conclusion, the real-time monitoring and reliable evaluation of the running state and the health condition of the transformer can be realized by performing real-time measurement, recording, calculation and analysis on non-electricity information such as oil pressure, oil flow and body acceleration in the oil-immersed power transformer, which have important engineering practical value and significance.

SUMMARY

The present disclosure aims to provide a transformer monitoring apparatus and a transformer monitoring method based on non-electricity comprehensive characteristic information, which are used for measuring, recording and analyzing non-electricity information such as transient oil pressure, oil flow, acceleration and the like in an oil-immersed power transformer and evaluating the running state of the transformer according to the non-electricity information.

In order to realize the purpose, the present disclosure adopts the following technical solutions.

A transformer monitoring apparatus based on non-electricity comprehensive characteristic information is provided. The apparatus includes a transient oil pressure characteristic measuring module; a transient oil flow characteristic measuring module; a transient acceleration characteristic measuring module; a signal conditioning and acquiring module; and a digital processing and analyzing module. The transient oil pressure characteristic measuring module, the transient oil flow characteristic measuring module, and the transient acceleration characteristic measuring module are each connected to the signal conditioning and acquiring module, and the signal conditioning and acquiring module is connected to the digital processing and analyzing module. The transient oil pressure characteristic measuring module is configured to measure internal oil pressure change characteristics of different positions of a transformer and output analog voltage/current signals corresponding to the internal oil pressure change characteristics. The transient oil flow characteristic measuring module is configured to measure transient oil flow change characteristics in an oil conservator connecting pipe of the transformer at a high speed in real time and output analog voltage/current signals corresponding to the transient oil flow change characteristics. The transient acceleration characteristic measuring module is configured to measure transient acceleration change characteristics of a body of the transformer and output analog voltage/current signals corresponding to the transient acceleration change characteristics. The signal conditioning and acquiring module is configured to receive the analog voltage/current signals output by the transient oil pressure characteristic measuring module, the analog voltage/current signals output by the transient oil flow characteristic measuring module, and the analog voltage/current signals output by the transient acceleration characteristic measuring module, convert the analog voltage/current signals into standard digital signals identifiable by the digital processing and analyzing module, and output the standard digital signals. The digital processing and analyzing module is configured to execute a monitoring calculation after receiving the standard digital signals to finish a digital signal processing task and realize functions of on-line monitoring of a transient oil pressure in an oil tank, a transient oil flow in the oil conservator connecting pipe, and a transient acceleration of the body, and evaluation of a running state of the transformer.

According to an improvement of the present disclosure, the transient oil pressure characteristic measuring module includes a plurality of high-frequency dynamic oil pressure sensors and communication cables of the plurality of high-frequency dynamic oil pressure sensors; the plurality of high-frequency dynamic oil pressure sensors is arranged on the body of the transformer, and end probes of the plurality of high-frequency dynamic oil pressure sensors are in direct contact with an insulating oil of the transformer to measure the internal oil pressure change characteristics of different positions of the transformer, and output the analog voltage/current signals corresponding to the internal oil pressure change characteristics through the communication cables; and, wherein the plurality of high-frequency dynamic oil pressure sensors has a measuring frequency of 20 kHz, a measuring error smaller than 1%, a working temperature ranging from −45° C. to 120° C., and a measuring range of −0.1 MPa to 6 MPa.

According to an improvement of the present disclosure, the transient oil flow characteristic measuring module includes an external clip type high-frequency ultrasonic flowmeter, a flowmeter transmitter, and a communication cable, wherein the external clip type high-frequency ultrasonic flowmeter is connected to the flowmeter transmitter, the flowmeter transmitter is connected to the communication cable, and the external clip type high-frequency ultrasonic flowmeter is arranged on the oil conservator connecting pipe of the transformer and is arranged at 100 mm to 300 mm in front of a gas relay; and wherein the external clip type high-frequency ultrasonic flowmeter has a measuring frequency greater than or equal to 100 Hz, a measuring error smaller than 1%, a working temperature ranging from −30° C. to 80° C., and a flow speed range of −20 m/s to 20 m/s.

According to an improvement of the present disclosure, the transient acceleration characteristic measuring module includes a plurality of acceleration sensors, a transmitter, and a communication cable, wherein the plurality of acceleration sensors is strongly magnetically adsorbed on an outer wall of the body of the transformer and is connected to the transmitter, and the transmitter is connected to the communication cable; and wherein the plurality of acceleration sensors has a measuring frequency greater than or equal to 10 kHz, a measuring error smaller than 1%, a working temperature ranging from −40° C. to 80° C., and an acceleration range of −1000 g to 1000 g. The signal conditioning and acquiring module includes a connecting terminal, a signal conditioning circuit, a low-pass filter, a signal sampling circuit, and an analog-digital (A/D) conversion circuit, wherein the connecting terminal is connected to the signal conditioning circuit, the signal conditioning circuit is further connected to the low-pass filter, the low-pass filter is further connected to the signal sampling circuit, the signal sampling circuit is further connected to the A/D conversion circuit, and the connecting terminal is further connected to the transient oil pressure characteristic measuring module, the transient oil flow characteristic measuring module, and the transient acceleration characteristic measuring module.

According to an improvement of the present disclosure, the digital processing and analyzing module includes a bus, a central processing unit, a GPS synchronous clock, a random access memory, a read-only memory, and a control circuit, wherein the central processing unit, the GPS synchronous clock, the random access memory, and the control circuit are all connected to the bus; the A/D conversion circuit is connected to the bus; the bus includes a data bus, an address bus, and a control bus and is configured to enable a data exchange and an operation control; the central processing unit is a single chip microprocessor, a general microprocessor, or a digital signal processor and is configured to enable real-time digital signal processing; the GPS synchronous clock is configured to meet a synchronous sampling requirement of respective station devices in a transformer substation and a system; the random access memory is configured to temporarily store temporary data; the read-only memory is configured to store data; and the control circuit is configured to enable connection and coordination operation of a whole digital circuit by using a field programmable gate array.

According to an improvement of the present disclosure, the apparatus further includes a data storage module; a man-machine conversation module; and a data communication interface module. The data storage module, the man-machine conversation module, and the data communication interface module are connected to the digital processing and analyzing module. The data storage module is configured to store data. The man-machine conversation module is configured to establish information connection between a digital protection device and a user to facilitate manual operations and debugging of the protection device by the operator and obtaining of information feedback. The data communication interface module is configured to realize information interaction, data transmission, remote operation, and remote maintenance with other devices and a master station by using an Ethernet.

According to an improvement of the present disclosure, the man-machine conversation module includes a compact keyboard, a display screen, an indicator light, buttons, and a printer interface. The data storage module is composed of a main flash memory and an auxiliary flash memory, the main flash memory serves as a main memory, and the auxiliary flash memory serves as a backup memory. The data communication interface module follows an IEC 61850 communication protocol, and is configured to realize information interaction, data transmission, remote operation, and remote maintenance with other devices and a master station through Ethernet.

A monitoring method using the transformer monitoring apparatus based on the non-electricity comprehensive characteristic information is provided. The method includes: performing measurement, recording, calculation, and analysis for a transient oil pressure, an oil flow, and an acceleration of the body of the transformer respectively to realize real-time monitoring and reliable evaluation of a running state of the transformer;

said performing measurement, recording, calculation and analysis for the transient oil pressure includes:

step 1 of measuring, by the transient oil pressure characteristic measuring module, the oil pressure change characteristics of different positions in the transformer, i.e., reading oil pressures $p_{ms.n}(t)$ of n measuring points in the transformer at a current moment t, where n is 1, 2, 3 . . . , outputting the analog voltage/current signals corresponding to the oil pressure change characteristics; receiving, by the signal conditioning and acquiring module, the analog voltage/current signals output by the transient oil pressure characteristic measuring module, converting the analog voltage/current signals into standard digital signals identifiable by the digital processing and analyzing module, and outputting the standard digital signals;

step 2 of comparing, by the digital processing and analyzing module, a transient oil pressure $p_{ms.n}(t)$ of each of the n measuring points with a predetermined starting threshold $p_{st}$ after receiving the standard digital signals, entering step 3 when the transient oil pressure $p_{ms.n}(t)$ of any one of the n measuring points is greater than or equal to the predetermined starting threshold $p_{st}$, i.e., when a formula (1) is satisfied, and indicating that an oil pressure in the transformer is normal and entering step 5 when the oil pressure $p_{ms.n}(t)$ of each of the n measuring points is smaller than the predetermined starting threshold $p_{st}$, i.e., when the formula (1) is not satisfied, $$p_{ms.n}(t) - p_{st} \geq 0 \qquad (1);$$

step 3 of calculating an operating oil pressure $p_{op.n}(t)$ of each of the n measuring points at a moment t through the following formula:

$$p_{op.n}(t) = \frac{1}{T \cdot f} \int_{t-T}^{t} p_{ms.n}(t)dt, \qquad (2)$$

where T represents a length of a data window, and f represents a signal sampling frequency of an acquisition module;

comparing the operating oil pressure $p_{op.n}(t)$ with an overpressure alarm threshold pth.1, issuing an overpressure alarm inside the transformer and entering step 5 when the operating oil pressure $p_{op.n}(t)$ is greater than or equal to the overpressure alarm threshold pth.1, i.e., when a formula (3) is satisfied; and entering step 4 when the operating oil pressure $p_{op.n}(t)$ is smaller than the overpressure alarm threshold, i.e., when the formula (3) is not satisfied, $$p_{op.n}(t) - p_{th.1} \geq 0 \qquad (3);$$

step 4 of comparing the operating oil pressure $p_{op.n}(t)$ with a quasi-overpressure early alarm threshold pth.2; issuing a quasi-overpressure early alarm inside the oil tank and entering step 5 when the $p_{op.n}(t)$ is greater than or equal to the quasi-overpressure early alarm threshold pth.2, i.e., when a formula (4) is satisfied; and indicating that the oil pressure in the transformer is normal when the $p_{op.n}(t)$ is smaller than the quasi-overpressure early alarm threshold pth.2, i.e., when the formula (4) is not satisfied, $$p_{op.n}(t) - p_{th.2} \geq 0 \qquad (4);$$

step 5 of storing measured oil pressure data and communicating the oil pressure data to a master station; and step 6 of performing self-checking in the running state; when a fault of the apparatus is found, issuing an alarm signal, locking the whole apparatus, and waiting for a technical personnel for removing the fault and manually resetting; and when no fault of the apparatus is found, returning to step 1, and re-reading an oil pressure $p_{ms.n}(t+1)$ at a next moment;

Said performing measurement, recording, calculation and analysis for the transient oil flow includes:

step A of measuring, by the transient oil flow characteristic measuring module, transient oil flow change characteristics in the oil conservator connecting pipe of the transformer at a high speed in real time, and outputting analog voltage/current signals corresponding to the transient oil flow change characteristics; and receiving, by the signal conditioning and acquiring module, the analog voltage/current signals output by the transient oil flow characteristic measuring module, converting the analog voltage/current signals into standard digital signals identifiable by the digital processing and analyzing module, and outputting the standard digital signals;

step B of comparing, by the digital processing and analyzing module, a transient oil flow rate $v_{ms}(t)$ with a predetermined starting threshold $v_{st}$ after receiving the standard digital signals; entering step C when the transient oil flow rate $v_{ms}(t)$ is greater than or equal to a predetermined starting threshold $v_{st}$, i.e., when a formula (a) is satisfied; and indicating that an oil flow of the transformer is normal and entering step E when the $v_{ms}(t)$ is smaller than the predetermined starting threshold $v_{st}$, i.e., when the formula (a) is not satisfied, $$v_{ms}(t)-v_{st} \geq 0 \quad (a);$$

step C of calculating an operating oil flow $v_{op}(t)$ at a moment t using the following formula:

$$v_{op}(t) = \frac{1}{T \cdot f} \int_{t-T}^{t} v_{ms}(t)dt, \quad (b)$$

where T represents a length of a data window, and f represents a signal sampling frequency of an acquisition module; and comparing the operating oil flow $v_{op}(t)$ with an overflow alarm threshold $v_{th.1}$; issuing an overflow alarm of the transformer and entering step E when the operating oil flow $v_{op}(t)$ is greater than or equal to the overflow alarm threshold $v_{th.1}$, i.e., when a formula (c) is satisfied; and entering step D when the operating oil flow $v_{op}(t)$ is smaller than the overflow alarm threshold $v_{th.1}$, i.e., when the formula (c) is not satisfied, $$v_{op}(t)-v_{th.1} \geq 0 \quad (c);$$

step D of comparing the operating oil flow $v_{op}(t)$ with a quasi-overflow early alarm threshold $v_{th.2}$; issuing a quasi-overflow early alarm of the transformer, and entering step E when the operating oil flow is greater than or equal to the quasi-overflow early alarm threshold $v_{th.2}$, i.e., when a formula (d) is satisfied; and indicating that the oil flow in the transformer is normal when the operating oil flow is smaller than the quasi-overflow early alarm threshold $v_{th.2}$, i.e., when the formula (d) is not satisfied, $$v_{op}(t)-v_{th.2} \geq 0 \quad (d);$$

step E of storing measured oil flow data and communicating the oil flow data to the master station; and step F of performing self-checking in the running state; when a fault of the apparatus is found, issuing an alarm signal, locking the whole apparatus, and waiting for a technical personnel for removing the fault and manually resetting; and when no fault of the apparatus is found, returning to step A, and re-reading an oil flow rate $v_{ms}(t+1)$ at a next moment;

Said performing measurement, recording, calculation and analysis for the transient acceleration includes:

step I of measuring, by the transient acceleration characteristic measuring module, the transient acceleration change characteristics of the body of the transformer, i.e., accelerations $a_{ms.n}(t)$ of n measuring points of the body of the transformer at a current moment t, where n is 1, 2, 3 ..., and outputting the analog voltage/current signals corresponding to the transient acceleration change characteristics; and receiving, by the signal conditioning and acquiring module, the analog voltage/current signals output by the transient acceleration characteristic measuring module, converting the analog voltage/current signals into standard digital signals identifiable by the digital processing and analyzing module, and outputting the standard digital signals;

step II of comparing, by the digital processing and analyzing module, each of the accelerations $a_{ms.n}(t)$ of the n measuring points and a predetermined starting threshold $a_{st}$ after receiving the standard digital signals;

entering step III when any one of the accelerations $a_{ms.n}(t)$ of the n measuring points is greater than or equal to the predetermined starting threshold $a_{st}$, i.e., when a formula (i) is satisfied; indicating that vibration in the transformer is normal and entering step V when all of the accelerations $a_{ms.n}(t)$ of the n measuring points are smaller than the predetermined starting threshold $a_{st}$, i.e., when the formula (i) is not satisfied, $$a_{ms.n}(t)-a_{st} \geq 0 \quad (i);$$

step III of calculating an operating acceleration $a_{op.n}(t)$ of each of the n measuring points at the moment t by the following formula:

$$a_{op.n}(t) = \left| \frac{1}{T \cdot f} \int_{t-T}^{t} a_{ms.n}(t)dt \right|, \quad (ii)$$

where T represents a length of a data window, and f represents a signal sampling frequency of an acquisition module; and comparing the operating acceleration $a_{op.n}(t)$ with an over-vibration alarm threshold $a_{th.1}$; issuing an over-vibration alarm of the transformer and entering step V when the operating acceleration $a_{op.n}(t)$ is greater than or equal to the over-vibration alarm threshold $a_{th.1}$, i.e., when a formula (iii) is satisfied; and entering step IV when the operating acceleration $a_{op.n}(t)$ is smaller than the over-vibration alarm threshold $a_{th.1}$, i.e., when the formula (11) is not satisfied, $$a_{op.n}(t)-a_{th.1} \geq 0 \quad (iii);$$

step IV of comparing the operating acceleration $a_{op.n}(t)$ with a quasi-over-vibration early alarm threshold $a_{th.2}$; issuing a quasi-over-vibration early alarm of the transformer and entering step V when the $a_{op.n}(t)$ is greater than or equal to the quasi-over-vibration early alarm threshold $a_{th.2}$, i.e., when a formula (iv) is satisfied; and indicating that the vibration in the transformer is normal when the $a_{op.n}(t)$ is smaller than the quasi-over-vibration early alarm threshold $a_{th.2}$, i.e., the formula (iv) is not satisfied, $$a_{op.n}(t)-a_{th.2} \geq 0 \quad (iv);$$

step V of storing measured acceleration data and communicating the acceleration data to the master station; and step VI of performing self-checking in the running state; when a fault of the apparatus is found, issuing an alarm signal, locking the whole apparatus, and waiting for a technical personnel for removing the fault and manually resetting; and when no fault of the apparatus is found, returning to step I and re-reading accelerations $a_{ms.n}(t+1)$ at a next moment.

According to an improvement of the present disclosure, in step 2, the predetermined starting threshold $p_{st}$ is set to 35 kPa; in step 3, the length T of the data window is $5 \times 10^{-3}$ s, and the overpressure alarm threshold $p_{th.1}$ is 70 kPa; and in step 4, the quasi-overpressure early alarm threshold $p_{th.2}$ is 55 kPa.

According to an improvement of the present disclosure, in step B, the predetermined starting threshold $v_{st}$ ranging from 0.2 m/s to 0.4 m/s; in step C, the overflow alarm threshold $v_{th.1}$ is set to 0.7 m/s; in step C, the length T of the data window is 0.02 s; and in step D, the quasi-overflow early alarm threshold $v_{th.2}$ is 0.5 m/s; and in step II, the predetermined starting threshold $a_{st}$ is set to 2.5 g; in step III, the length T of the data window is $1 \times 10^{-3}$ s, and the over-vibration alarm threshold $a_{th.1}$ is 20 g; and in the step IV, the quasi-over-vibration early alarm threshold $a_{th.2}$ is 10 g.

Compared with the related art, the present disclosure has the following beneficial effects.

According to the present disclosure, the transient oil pressure characteristic measuring module, the transient oil flow characteristic measuring module and the transient acceleration characteristic measuring module are used for measuring the non-electricity characteristics such as internal oil pressure, oil flow in an oil conservator connecting pipe, acceleration of the body at different positions of the transformer, both the precision or the application range of which can satisfy requirements of a high-temperature, oily, and strong electromagnetic environment in the power transformer; the on-line monitoring apparatus of the present disclosure is independent of a power network, the measurement of respective non-electricity characteristics and the signal transmission are less interfered, and no harmonic waves are injected into a power system; and the digital processing and analyzing module can completely meet requirements of quickly processing multi-channel and high-frequency data in real time. The present disclosure has the advantages of simple structure, easy implementation, reliability, high efficiency, etc.

Furthermore, the high-frequency dynamic oil pressure sensor with a measuring frequency of 20 kHz, a measuring error smaller than 1%, a working temperature ranging from −45° C. to 120° C. and a measuring range of −0.1 MPa to 6 MPa is adopted, and the high-frequency dynamic oil pressure sensor can meet the requirements of a high-temperature, oily, and strong electromagnetic environment in the power transformer in terms of precision and application range.

Furthermore, the flowmeter with a measuring frequency greater than or equal to 100 Hz, a measuring error smaller than 1%, a working temperature ranging from −30° C. to 80° C., and a flow speed range of −20 m/s to 20 m/s is adopted, the external clip type high-frequency ultrasonic flowmeter can realize the real-time measurement of the flow speed of the oil flow without damaging a structural integrity of the conservator connecting pipe of the transformer, and meanwhile, the high-frequency ultrasonic flowmeter can meet the requirements of a high-temperature and strong electromagnetic environment of the body of the power transformer in terms of precision and application range.

Furthermore, the acceleration sensor with a measuring frequency greater than or equal to 10 kHz, a measuring error smaller than 1%, a working temperature ranging from −40° C. to 80° C., and an acceleration range of −1000 g to 1000 g is adopted, the high-frequency dynamic acceleration sensor can realize the real-time measurement of the acceleration of the body without damaging the structural integrity of the body of the transformer, and meanwhile, the acceleration sensor can meet the requirements of a high-temperature and strong electromagnetic environment of the body of the power transformer in terms of precision and application range.

During monitoring, a on-line monitoring and evaluating device for the power transformer based on non-electricity comprehensive characteristic information analysis is formed by physically connection and functional coordination of the transient oil pressure characteristic measuring module, the transient oil flow characteristic measuring module, the transient acceleration characteristic measuring module, the signal conditioning and acquiring module, and the digital processing and analyzing module. Meanwhile, the monitoring apparatus is controlled according to the online monitoring principle and the functional requirements to realize the operations of measurement, calculation, recording, communication and the like of the transient non-electricity information of the tested transformer. The operating oil pressure, operating oil flow and operating acceleration, which can completely characterize average kinetic energy of oil pressure, oil flow and acceleration in the transformer, are obtained through filtering and integral operation of data of transient oil pressure, oil flow, and acceleration of a plurality of measuring points in the transformer, and by comparing the operating oil pressure, the operating oil flow, and the operating acceleration with the predetermined non-electricity starting, alarming, and early alarm thresholds respectively, the real-time monitoring and reliable evaluation of safety levels of various non-electricity characteristics in the transformer. The present disclosure originally provides a transformer monitoring apparatus and a transformer monitoring method based on non-electricity comprehensive characteristic information, and the application of the present disclosure has important engineering practical significance for transformer operators to accurately and reliably obtain non-electricity characteristic transient information of the transformer in real time and evaluate the safe running state of the transformer. The apparatus can run reliably for a long time without influence from strong electromagnetism and oily environments, has the advantages of high response rate and high measurement frequency, has no harmonic waves injected into the power system in the running process, and does not influence normal running of primary devices and secondary devices in a transformer substation.

DESCRIPTION OF EMBODIMENTS

The present disclosure will be described in detail with reference to the accompanying drawings.

Figure 1:
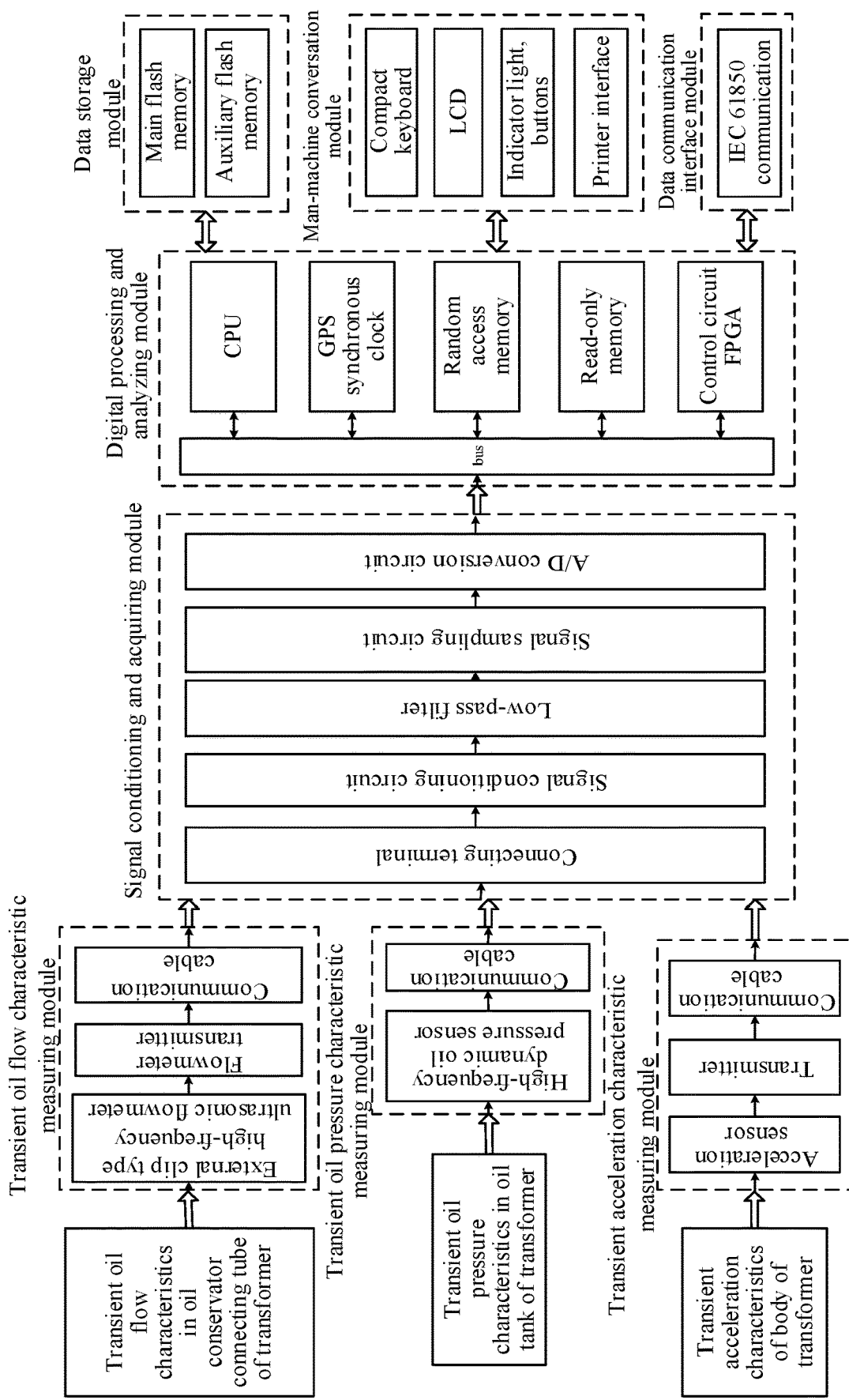
FIG. 1 is a schematic diagram of a structure of an apparatus according to the present disclosure.

Referring to FIG. 1, the present disclosure includes a transient oil pressure characteristic measuring module, a transient oil flow characteristic measuring module, a transient acceleration characteristic measuring module, a signal conditioning and acquiring module, a digital processing and analyzing module, a data storage module, a man-machine conversation module, and a data communication interface module. The transient oil pressure characteristic measuring module, the transient oil flow characteristic measuring module and the transient acceleration characteristic measuring module are each connected to the signal conditioning and acquiring module, and the signal conditioning and acquiring module, the data storage module, the man-machine conversation module, and the data communication interface module are each connected to the digital processing and analyzing module.

The transient oil pressure characteristic measuring module includes a plurality of high-frequency dynamic oil pressure sensors and communication cables of the plurality of high-frequency dynamic oil pressure sensors. The plurality of high-frequency dynamic oil pressure sensor is arranged on a body of a transformer, and end probes of the plurality of high-frequency dynamic oil pressure sensors need to be in direct contact with an insulating oil of the transformer to measure internal oil pressure change characteristics of different positions of the transformer and output analog voltage signals through the communication cables.

The transient oil flow characteristic measuring module includes an external clip type high-frequency ultrasonic flowmeter, a flowmeter transmitter, and a communication cable. The external clip type high-frequency ultrasonic flowmeter is arranged on an oil conservator connecting pipe of the transformer (100 mm to 300 mm in front of a gas relay). The external clip type high-frequency ultrasonic flowmeter is connected to the flowmeter transmitter, and the flowmeter transmitter is connected to the communication cable. The external clip type high-frequency ultrasonic flowmeter is configured to measure transient oil flow change characteristics in the oil conservator connecting pipe of the transformer at a high speed in real time, and the flowmeter transmitter and the communication cable are configured to output analog current signals corresponding to the transient oil pressure change characteristics. In order to ensure accurate and real-time acquisition of the oil flow of the transformer, the high-frequency ultrasonic flowmeter needs to have a measurement frequency greater than or equal to 100 Hz, a measurement error smaller than 1%, a working temperature ranging from −30° C. to 80° C., and a flow speed range of −20 m/s to 20 m/s.

The transient acceleration characteristic measuring module includes a plurality of acceleration sensors, a transmitter and a communication cable. The plurality of acceleration sensors is strongly magnetically adsorbed on an outer wall of the body of the transformer and is connected to the transmitter, and the transmitter is connected to the communication cable. The plurality of acceleration sensors is configured to measure transient acceleration change characteristics of the body of the transformer at a high speed in real time, and the transmitter and the communication cable are configured to output analog voltage signals corresponding to the transient acceleration change characteristics. The acceleration sensor needs to have a measuring frequency greater than or equal to 10 kHz, a measuring error smaller than 1%, a working temperature ranging from −40° C. to 80° C., and an acceleration range of −1000 g to 1000 g.

The signal conditioning and acquiring module includes a connecting terminal, a signal conditioning circuit, a low-pass filter, a signal sampling circuit, and an analog/digital (A/D) conversion circuit. The connecting terminal is connected to the signal conditioning circuit, the signal conditioning circuit is further connected to the low-pass filter, the low-pass filter is further connected to the signal sampling circuit, the signal sampling circuit is further connected to the A/D conversion circuit, and the connecting terminal is further connected to communication cables of the transient oil pressure characteristic measuring module, the transient oil flow characteristic measuring module, and the transient acceleration characteristic measuring module.

The signal conditioning and acquiring module is configured to receive the analog voltage/current signals output by the transient oil pressure characteristic measuring module, the transient oil flow characteristic measuring module, and the transient acceleration characteristic measuring module, convert the analog voltage/current signals into standard digital signals identifiable by the digital processing and analyzing module, and output the standard digital signals.

The digital processing and analyzing module includes a bus, a central processing unit (CPU), a GPS synchronous clock, a random access memory (RAM), a read-only memory (ROM), and a control circuit. The central processing unit (CPU), the GPS synchronous clock, the random access memory (RAM), the read-only memory (ROM), and the control circuit are all connected to the bus. The A/D conversion circuit is connected to the bus. The bus includes a data bus, an address bus, and a control bus, and is configured to realize data exchange, operation control, and the like. The central processing unit (CPU) is a command center of the digital processing and analyzing module, and devices such as a single chip microprocessor, a general microprocessor, or a digital signal processor (DSP) can be used to realize real-time fast digital signal processing. And the GPS synchronous clock is adopted to realize a synchronous sampling requirement of respective station devices in a transformer substation and a system. The Random Access Memory (RAM) is configured to temporarily store a large amount of temporary data which need to be quickly exchanged, including data information inputted by the signal conditioning and acquiring module, intermediate results in the calculation processing process, and the like. The read only memory (ROM) is configured to protect data. The control circuit is configured to utilize a Field Programmable Gate Array (FPGA) to realize the effective connection and coordination operation of the whole digital circuit. The digital processing and analyzing module is configured to realize data exchange and operation control, execute a monitoring algorithm, finish a digital signal processing task, and command the normal operation of the connected modules, thereby realizing functions of on-line monitoring of a transient oil pressure in an oil tank, a transient oil flow in the oil conservator connecting pipe, and a transient acceleration of the body and evaluation of a running state of the transformer.

The data storage module is composed of a main Flash Memory and an auxiliary Flash Memory. The main flash memory and the auxiliary flash memory serve as a main memory and a backup memory of the online monitoring apparatus.

The man-machine conversation module includes a compact keyboard, a display screen, an indicator light, buttons, a printer interface, etc. The man-machine conversation module is configured to establish information connection between the online monitoring apparatus and a user to facilitate manual operations and debugging of the the online monitoring apparatus by the operator, obtaining of information feedback, etc.

The data communication interface module follows an IEC 61850 communication protocol, and is configured to realize information interaction, data transmission, remote operation, and remote maintenance with other devices and a master station by using the Ethernet.

A monitoring method on the basis of the transformer monitoring apparatus based on the non-electricity comprehensive characteristic information includes: performing measurement, recording, calculation, and analysis for a transient oil pressure, an oil flow, and an acceleration of a body of a transformer respectively to realize real-time monitoring and reliable evaluation of a running state of the transformer. The specific process is described below.

Figure 2:
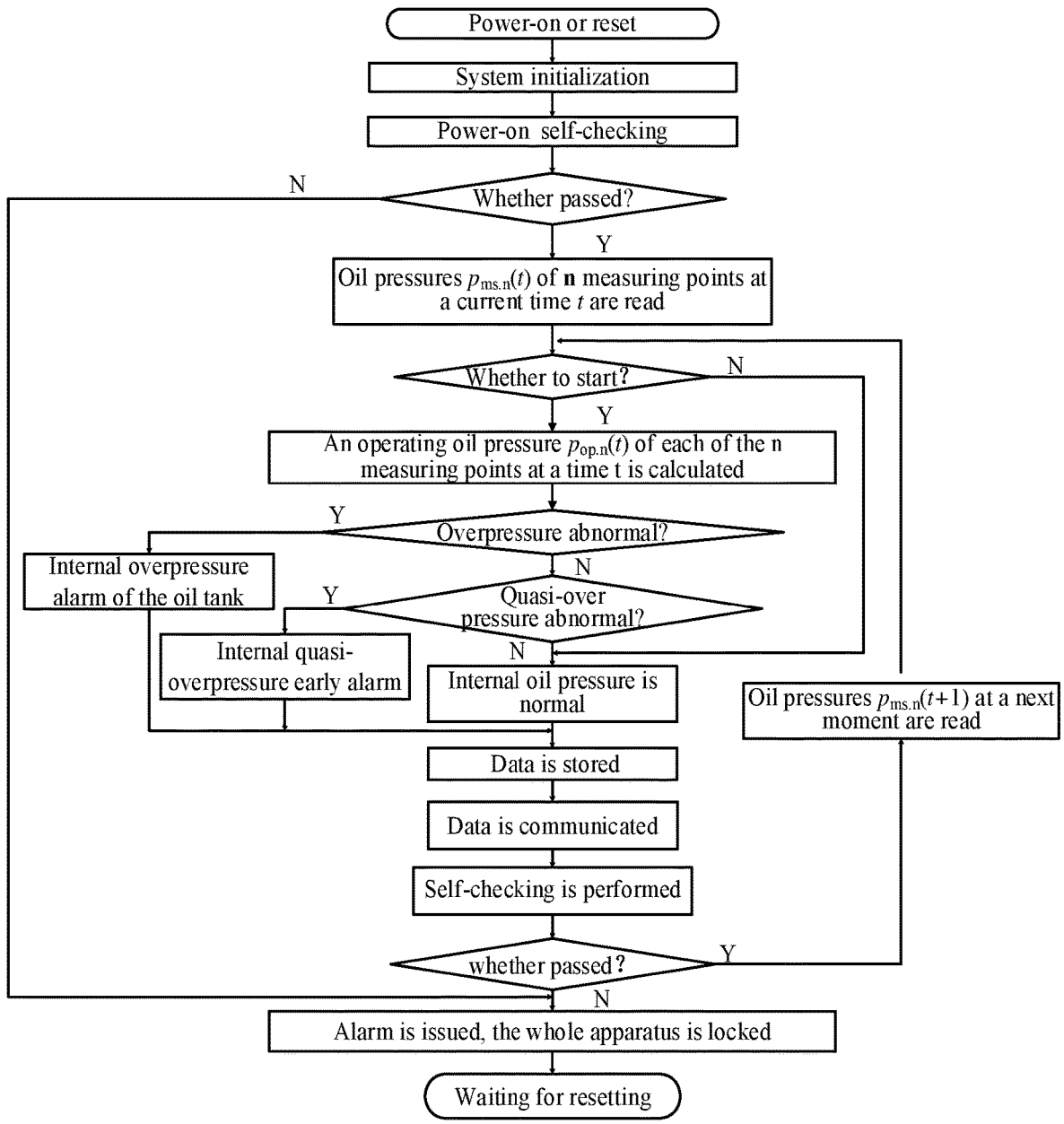
FIG. 2 is a flowchart of oil pressure monitoring according to the present disclosure.

Referring to FIG. 2, when the on-line monitoring and evaluation of the oil pressure of the transformer are performed, the transformer monitoring apparatus is controlled according to the on-line monitoring principle and the functional requirements, so as to realize the operations of measurement, calculation, recording, communication, state evaluation and the like of the transient oil pressure of the measured transformer. The specific process is as follows.

Step 1: After the on-line monitoring apparatus is powered on (for short, power-on) or the hardware is reset (for short, reset), a system initialization is executed firstly, so that the whole apparatus is in a normal working state.

Step 2: After power-on, a comprehensive self-checking is performed so that correctness and integrity detection on the working state of the apparatus is performed. When a fault of the apparatus is found, an alarm signal is issued and the whole apparatus is locked, and a technical personnel is waited for to remove the fault and manually reset.

Step 3: If the self-checking is passed, oil pressures $p_{ms.n}(t)$ of n measuring points in the transformer at a current moment t are read, where n is 1, 2, 3 . . . .

Step 4: Each of the transient oil pressures $p_{ms.n}(t)$ of the n measuring points is compared with a predetermined starting threshold $p_{st}$. The predetermined starting threshold $p_{st}$ can be set to 35 kPa. Step (5) is entered when any one of the transient oil pressures $p_{ms.n}(t)$ of the n measuring points is greater than or equal to the predetermined starting threshold $p_{st}$, i.e., a formula (1) is satisfied; and a normal oil pressure in the transformer is indicated and step 7 is entered when all of the oil pressures $p_{ms.n}(t)$ of the n measuring points are smaller than the predetermined starting threshold $p_{st}$, i.e., the formula (1) is not satisfied, $$p_{ms.n}(t)-p_{st} \geq 0 \qquad (1).$$

Step 5: an operating oil pressure $p_{op.n}(t)$ of each of the n measuring points at a moment t is calculated through the following formula:

$$p_{op.n}(t) = \frac{1}{T \cdot f} \int_{t-T}^{t} p_{ms.n}(t)dt, \qquad (2)$$

where T represents a length of a data window, which can be 5 ms, and f represents an oil pressure signal sampling frequency of an acquisition module. The operating oil pressure $p_{op.n}(t)$ is compared with an overpressure alarm threshold $p_{th.1}$. The overpressure alarm threshold $p_{th.1}$ can usually be set to 70 kPa. An internal overpressure alarm of the transformer is issued when the operating oil pressure $p_{op.n}(t)$ is greater than or equal to the overpressure alarm threshold $p_{th.1}$, i.e., a formula (3) is satisfied; and step (6) is entered when the operating oil pressure $p_{op.n}(t)$ is smaller than the overpressure alarm threshold, i.e., the formula (3) is not satisfied, $$p_{op.n}(t)-p_{th.1} \geq 0 \qquad (3).$$

Step 6: The operating oil pressure $p_{op.n}(t)$ is compared with a quasi-overpressure early warning threshold $p_{th.2}$. The quasi-overpressure early warning threshold $p_{th.2}$ can usually set to be 55 kPa. An quasi-overpressure early warning in the oil tank is issued when the $p_{op.n}(t)$ is greater than or equal to the quasi-overpressure early warning threshold $p_{th.2}$, i.e., a formula (4) is satisfied; and a normal oil pressure in the transformer is indicated when the $p_{op.n}(t)$ is smaller than the quasi-overpressure early warning threshold $p_{th.2}$, i.e., the formula (4) is not satisfied, $$p_{op.n}(t)-p_{th.2} \geq 0 \qquad (4).$$

Step 7: Measured oil pressure data is stored and the oil pressure data is communicated to a master station.

Step 8: Self-checking is performed in the running state. When a fault of the apparatus is found, an alarm signal is issued, the whole apparatus is locked, and a technical personnel is waited for to remove the fault and manually reset. When no fault of the apparatus is found, step 3 is returned to, and an oil pressure $p_{ms.n}(t+1)$ at a next moment is re-read.

Figure 3:
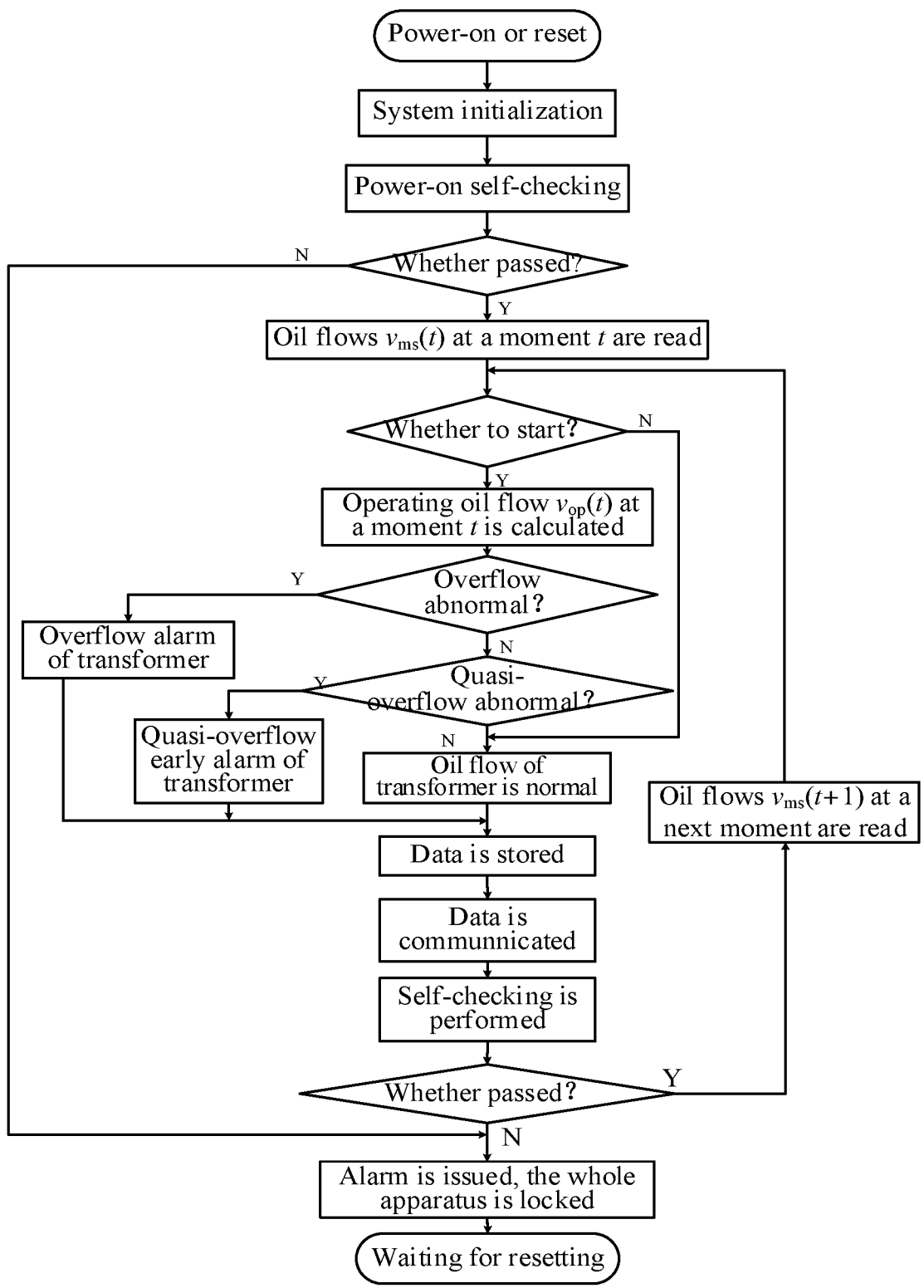
FIG. 3 is a flowchart of oil flow monitoring according to the present disclosure.

Referring to FIG. 3, when the on-line monitoring and evaluation of the oil flow of the transformer is performed, the transformer monitoring apparatus is controlled according to the on-line monitoring principle and the functional requirements, so as to realize the operations of measurement, calculation, recording, communication, state evaluation and the like of the transient oil flow of the measured transformer. The specific process is as follows.

Step A: After the on-line monitoring apparatus is powered on (for short, power-on) or the hardware is reset (for short, reset), a system initialization is executed firstly, so that the whole apparatus is in a normal working state.

Step B: After power-on, a comprehensive self-checking is performed, and a correctness and integrity detection on the working state of the apparatus is performed. When a fault of the apparatus is found, an alarm signal is issued, the whole apparatus is locked, and a technical personnel is waited for to remove the fault and manually reset.

Step C: An oil flow $v_{ms}(t)$ of the oil conservator connecting pipe of the transformer at a current time moment t is read when the apparatus passes the self-checking.

Step D: A transient oil flow $v_{ms}(t)$ is compared with and a predetermined starting threshold $v_{st}$. The predetermined starting threshold $v_{st}$ can be selected within a flow rate range of 0.2 m/s to 0.4 m/s depending on the inner diameter of the oil conservator connecting pipe. Step E is entered when the transient oil flow $v_{ms}(t)$ is greater than or equal to the predetermined starting threshold $v_{st}$, i.e., a formula (5) is satisfied; and a normal oil flow of the transformer is indicated and step G is entered when the $v_{ms}(t)$ is smaller than the predetermined starting threshold $v_{st}$, i.e., the formula (5) is not satisfied, $$v_{ms}(t)-v_{st}\geq 0 \tag{5}$$

Step E: An operating oil flow $v_{op}(t)$ at a moment t is calculated using the following formula:

$$v_{op}(t) = \frac{1}{T_v \cdot f_v} \int_{t-T_v}^{t} v_{ms}(t)dt, \tag{6}$$

where $T_v$ represents a length of a data window, which can usually be 50 ms, and $f_v$ represents an oil flow signal sampling frequency of an acquisition module. The operating oil flow $v_{op}(t)$ is compared with an overflow alarm threshold $v_{th.1}$. The overflow alarm threshold $v_{th.1}$ can usually be set to 0.7 m/s. An overflow alarm of the transformer is issued when the operating oil flow $v_{op}(t)$ is greater than or equal to the overflow alarm threshold $v_{th.1}$, i.e., a formula (7) is satisfied; and step F is entered when the operating oil flow $v_{op}(t)$ is smaller than the overflow alarm threshold $v_{th.1}$, i.e., the formula (7) is not satisfied, $$v_{op}(t)-v_{th.1}\geq 0 \tag{7}$$

Step F: The operating oil flow $v_{op}(t)$ is compared with a quasi-overflow early warning threshold $v_{th.2}$. The quasi-overflow early warning threshold $v_{th.2}$ can usually be set to 0.5 m/s. A quasi-overflow early warning of the transformer is issue when the $v_{op}(t)$ is greater than or equal to the quasi-overflow early warning threshold $v_{th.2}$, i.e., a formula (8) is satisfied; and a normal oil flow in the transformer is indicated when the $v_{op}(t)$ is smaller than the quasi-overflow early warning threshold $v_{th.2}$, i.e., the formula (8) is not satisfied, $$v_{op}(t)-v_{th.2}\geq 0 \tag{8}$$

Step G: Measured oil flow data is stored and the oil flow data is communicated to the master station.

Step H: Self-checking is performed in the running state. When a fault of the apparatus is found, an alarm signal is issued, the whole apparatus is locked, and a technical personnel is waited for to remove the fault and manually reset the apparatus. When no fault of the apparatus is found, step C is returned to, and an oil flow $v_{ms}(t+1)$ at a next moment is re-read.

Figure 4:
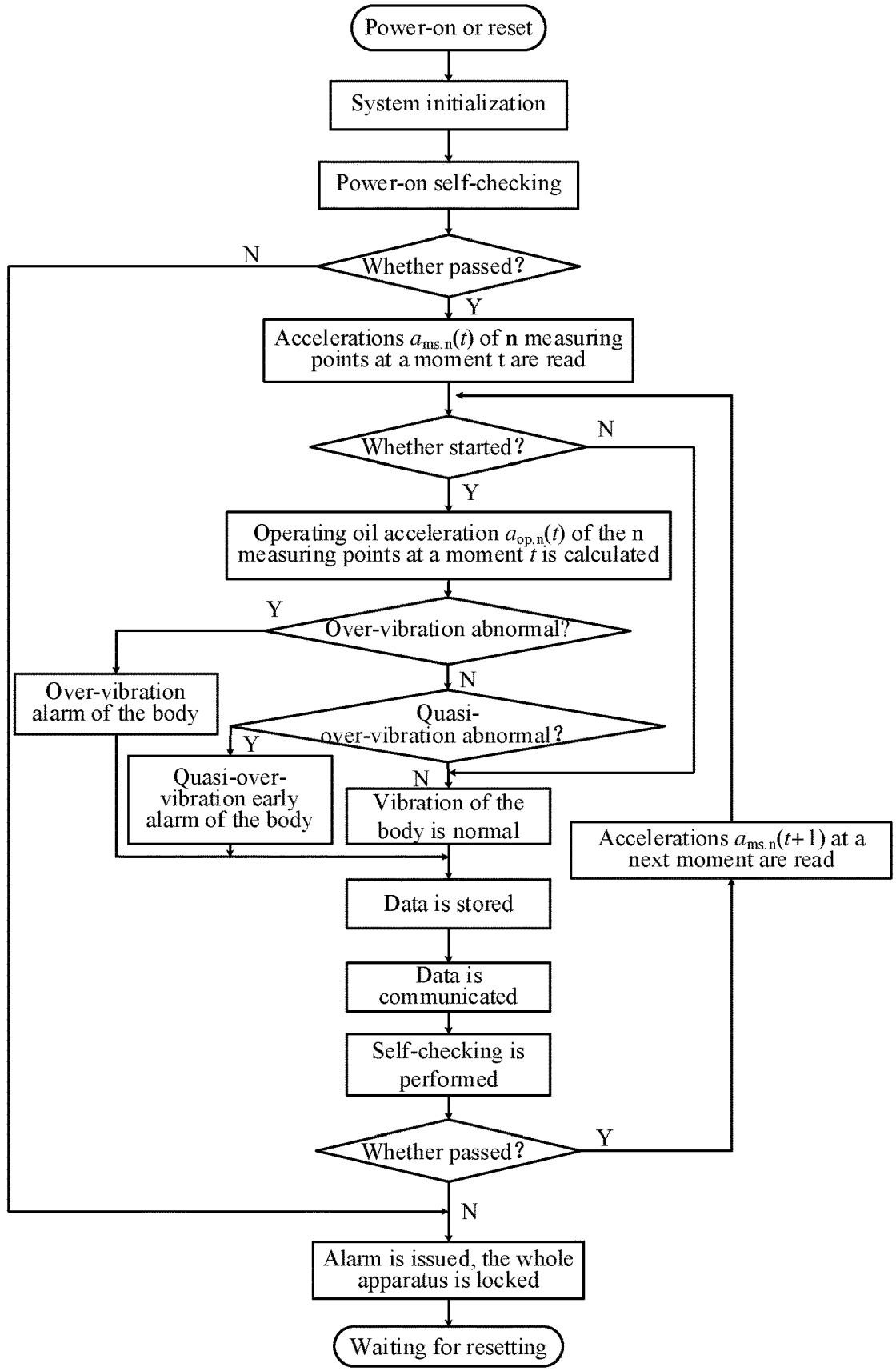
FIG. 4 is a flowchart of acceleration monitoring according to the present disclosure.

Referring to FIG. 4, when the acceleration of the body of the transformer is monitored and evaluated on line, the transformer monitoring apparatus is controlled according to the online monitoring principle and the functional requirements, so as to realize operations of measurement, calculation, recording, communication, state evaluation and the like of the transient acceleration of the measured transformer. The specific process is as follows.

Step I: After the on-line monitoring apparatus is powered on (for short, power-on) or the hardware is reset (for short, reset), a system initialization is executed firstly, so that the whole apparatus is in a normal working state.

Step II: After power-on, s comprehensive self-checking is performed, and a correctness and integrity detection on the working state of the apparatus is performed. When a fault of the apparatus is found, an alarm signal is issued, the whole apparatus is locked, and a technical personnel is waited for to remove the fault and manually reset the apparatus.

Step III: When the apparatus passes the self-checking, accelerations $a_{ms.n}(t)$ of n measuring points of the body of the transformer at a current time moment t are read, where n is 1, 2, 3 . . . .

Step IV: A transient acceleration $a_{ms.n}(t)$ is compared with a predetermined starting threshold $a_{st}$. The predetermined starting threshold $a_{st}$ can usually be set to 25 g. Step V is entered when a transient acceleration $a_{ms.n}(t)$ of any of the n measuring points is greater than or equal to the predetermined starting threshold $a_{st}$, i.e., a formula (9) is satisfied. A normal vibration of the body of the transformer is indicated and step VII is entered when all of the accelerations $a_{ms.n}(t)$ of the n measuring points are smaller than the predetermined starting threshold $a_{st}$, i.e., the formula (9) is not satisfied, $$a_{ms.n}(t)-a_{st}\geq 0 \tag{9}$$

Step 5: An operating acceleration $a_{op.n}(t)$ of each of the n measuring points at the moment t is calculated by the following formula:

$$a_{op.n}(t) = \frac{1}{T_a \cdot f_a} \int_{t-T_a}^{t} (|a_{ms.n}(t)| - a_{st})dt, \tag{10}$$

where $T_a$ represents a length of a data window, which may be 1 ms, and $f_a$ represents an acceleration signal sampling frequency of an acquisition module. The operating acceleration $a_{op.n}(t)$ is compared with an over-vibration alarm threshold $a_{th.1}$. The over-vibration alarm threshold $a_{th.1}$ can be set to 100 g. An over-vibration alarm of the transformer is issued when the operating acceleration $a_{op.n}(t)$ is greater than or equal to the over-vibration alarm threshold $a_{th.1}$, i.e., a formula (11) is satisfied. Step VI is entered when the operating acceleration $a_{op.n}(t)$ is smaller than the over-vibration alarm threshold $a_{th.1}$, i.e., the formula (11) is not satisfied, $$a_{op.n}(t)-a_{th.1}\geq 0 \tag{11}$$

Step VI: The operating acceleration $a_{op.n}(t)$ is compared with a quasi-over-vibration early warning threshold $a_{th.2}$. The quasi-over-vibration early warning threshold $a_{th.2}$ can usually be set to 50 g. A quasi-over-vibration early warning of the transformer is issued when the $a_{op.n}(t)$ is greater than or equal to the quasi-over-vibration early warning threshold $a_{th.2}$. A normal vibration of the body of the transformer is indicated when the $a_{op.n}(t)$ is smaller than the quasi-over-vibration early warning threshold $a_{th.2}$, $$a_{op.n}(t)-a_{th.2}\geq 0 \tag{12}$$

Step VII: Measured acceleration data is stored and the acceleration data is communicated to the master station.

Step VIII: Self-checking is performed in the running state. When a fault of the apparatus is found, an alarm signal is issued, the whole apparatus is locked, and a technical personnel is waited for to remove the fault and manually resetting the apparatus. When no fault of the apparatus is found, step III is returned to and accelerations $a_{ms.n}(t+1)$ at a next moment is re-read.

In the present disclosure, the power transformer on-line monitoring apparatus based on the non-electricity comprehensive characteristic information is formed by physically connecting and functionally coordinating the transient oil pressure characteristic measuring module, the transient oil flow characteristic measuring module, the transient acceleration characteristic measuring module, the signal conditioning and acquiring module, the digital processing and analyzing module, the data storage module, the man-machine conversation module, and the data communication interface module. Meanwhile, the apparatus is controlled according to the online monitoring principle and the functional requirements, and the operations of measuring, calculation, recording, communication and the like of the transient oil pressure, oil flow and body acceleration of the measured transformer are realized.

In the present disclosure, the transient oil pressure characteristic measuring module is used to measure the internal oil pressure change characteristics of different positions of the transformer. Since the transient oil pressure characteristic measuring module is independent of a power network, the measurement of the oil pressure characteristics and the signal transmission are less interfered, and no harmonic waves are injected into a power system; the data acquisition element and the oil pressure operation analysis element can completely meet the requirements of rapidly processing multi-channel and high-frequency data in real time. The present disclosure has the advantages of simple structure, easy implementation, reliability, high efficiency and the like.

Furthermore, the high-frequency dynamic oil pressure sensors with the measuring frequency of 20 kHz, the measuring error smaller than 1%, the working temperature ranging from −45° C. to 120° C., and the measuring range of −0.1 MPa to 6 MPa are adopted, and the high-frequency dynamic oil pressure sensors can meet the requirements of a high-temperature, oily, and strong electromagnetic environment in the power transformer in terms of precision and application range.

Furthermore, the external clip type high-frequency ultrasonic flowmeter with the measuring frequency greater than or equal to 100 Hz, the measuring error smaller than 1%, the working temperature ranging from −30° C. to 80° C., and the flow speed range of −20 m/s to 20 m/s is adopted, and the external clip type high-frequency ultrasonic flowmeter can meet the requirements of a high-temperature, oily, and strong electromagnetic environment in the power transformer in terms of precision and application range. The internal oil flow of the oil conservator connecting pipe is measured in real time without damaging the existing structural integrity of the transformer through the external clip type high-frequency ultrasonic flowmeter.

The present disclosure realizes the real-time measurement of the acceleration of the body of the transformer without damaging the structural integrity of the body through the transient acceleration characteristic measuring module. The online monitoring apparatus of the present disclosure is independent of the power network, the measurement of acceleration characteristics and signal transmission are less interfered, and no harmonic waves are injected into a power system; the data acquisition element and the acceleration operation analysis element can completely meet the requirements of rapidly processing multi-channel and high-frequency data in real time. The present disclosure has the advantages of simple structure, easy implementation, reliability, high efficiency and the like.

Furthermore, the acceleration sensors with the measuring frequency greater than or equal to 10 kHz, the measuring error smaller than 1%, the working temperature ranging from −40° C. to 80° C., and the acceleration range of −1000 g to 1000 g are adopted. The high-frequency dynamic acceleration sensor can meet the requirements of a high-temperature and strong electromagnetic environment in the body of the power transformer in terms of precision and application range.

Furthermore, by filtering and integral operation of data of transient oil pressure, oil flow, and acceleration of a plurality of measuring points in the transformer, the operating oil pressure, operating oil flow, and operating acceleration, which can completely represent average kinetic energy of the oil pressure, the oil flow and the acceleration in the transformer, are obtained, and by comparing the operating oil pressure, operating oil flow, and operating acceleration with the predetermined non-electricity starting threshold, alarm threshold, and pre-alarm threshold, the real-time monitoring and reliable evaluation of safety level of respective non-electricity characteristics in the transformer are realized. The present disclosure has important engineering practical significance for transformer operators to accurately and reliably acquire transient information of non-electricity characteristics of the transformer in real time and evaluate the safe running state of the transformer. The apparatus of the present disclosure can run reliably for a long time, is not influenced by strong electromagnetism and oily environments, has the advantages of high response rate and high measurement frequency, does not inject harmonic waves into a power system in the running process, and does not influence the normal running of the primary devices and the secondary devices in a transformer substation. Related research, report and products are not found in China or abroad.

Figure 5:
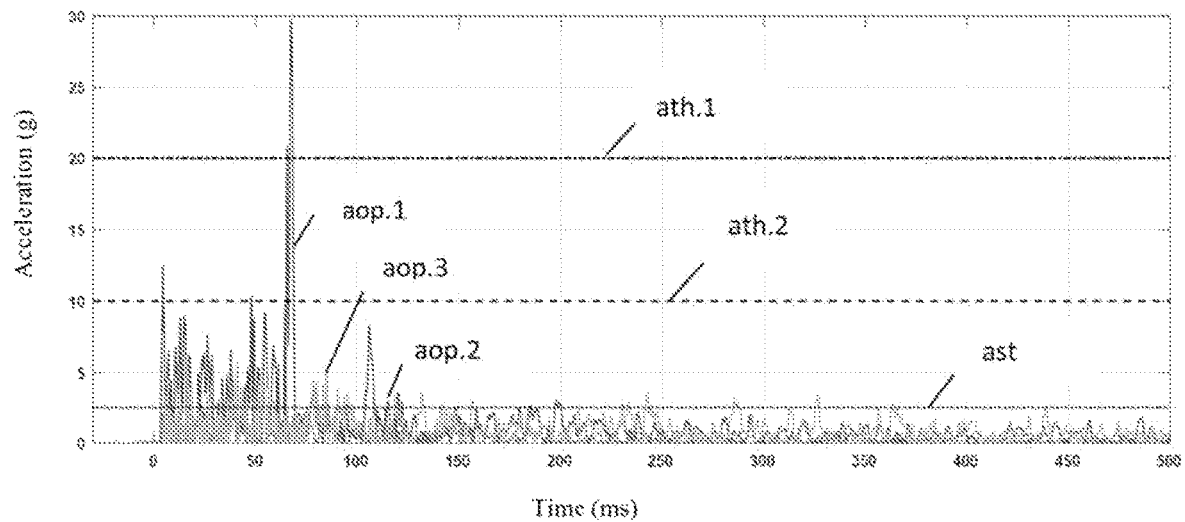
FIG. 5 shows a verification result of an acceleration characteristic monitoring test of a transformer on-line monitoring apparatus based on non-electricity comprehensive characteristic information.

An SFSZ8-40000/110 three-phase three-winding transformer was used as a test platform for field test to illustrate the effects of the present disclosure, and a main geometric structure and nameplate parameters of the transformer are shown in Table 1. As shown in FIG. 5, when the transformer operated normally (t<0 ms), the box body of the transformer did not vibrate significantly, at this time, the operating accelerations $a_{op.1}$, $a_{op.2}$, and $a_{op.3}$ measured and calculated by the apparatus were all far smaller than the over-vibration alarm threshold $a_{th.1}$ and the quasi-over-vibration early alarm threshold $a_{th.2}$, and the apparatus did not issue an alarm or early alarm signal and indicated that the body of the transformer vibrated normally. When the transformer bursted an internal weak discharge fault at the time of t=0 ms, the body of the transformer was impacted by fault pressure to vibrate due to the injection of fault energy. When t=4.20 ms, the operating acceleration $a_{op.1}$ obtained by the apparatus through measurement and calculation was greater than the quasi-over-vibration early alarm threshold $a_{th.2}$ and the apparatus issued a quasi-over-vibration early alarm. When t=65.35 ms, the operating acceleration $a_{op.1}$ obtained by measurement and calculation of the apparatus was greater than the over-vibration alarm threshold $a_{th.1}$, and the apparatus issued an over-vibration alarm of the transformer.

TABLE 1

Main geometric structure and nameplate parameters of SFSZ8-40000/110 type transformer

| Parameters of transformer | Value | Unit |
|---|---|---|
| Type of transformer | SFSZ8-40000/110 | / |
| Rated capacity | 40 | MVA |
| Voltage combination | 121/38.5/10.5 | kV |
| Rated current | 190.9/599.8/2200 | A |
| Rated frequency | 50 | Hz |
| Cooling method | ONAF | / |
| Marking number of connection group | YNd11yn10 | / |
| Length of oil tank | 5400 | mm |
| Width of oil tank | 1730 | mm |
| Height of oil tank | 2925 | mm |
| Radius of oil conservator | 450 | mm |
| Length of oil conservator | 3550 | mm |
| Thickness of wall of oil tank | 8 | mm |

TABLE 1-continued

Main geometric structure and nameplate parameters of SFSZ8-40000/110 type transformer

| Parameters of transformer | Value | Unit |
| --- | --- | --- |
| Diameter of iron core | 620 | mm |
| Height of iron window | 1520 | mm |
| Width of iron window | 730 | mm |
| Low, medium and high voltage winding height | 1280/1280/1280 | mm |
| Number of Low, medium and high voltage winding turns | 100/212/665 | / |
| Number of low, middle and high voltage winding sections | 104/76/92 | / |
| Winding pre-tightening force | 2 | MPa |

Figure 6:
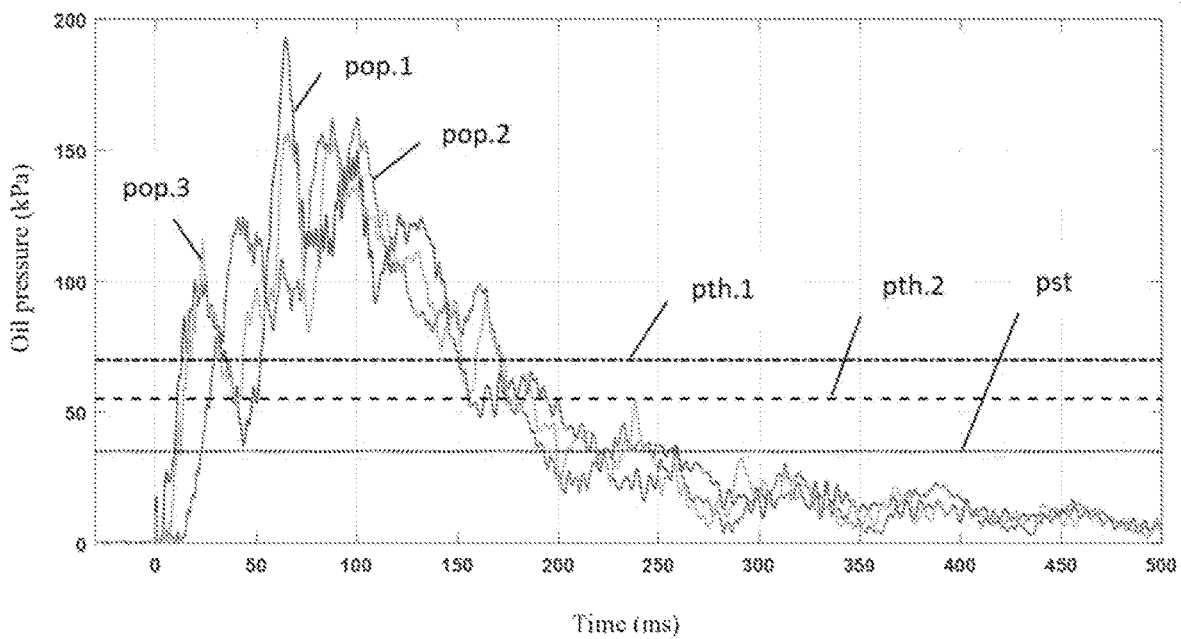
FIG. 6 shows a verification result of an oil pressure characteristic monitoring test of a transformer on-line monitoring apparatus based on non-electricity comprehensive characteristic information.

As shown in FIG. 6, when the transformer operated normally (t<0 ms), the oil pressure inside the oil tank of the transformer did not change significantly, and at this time, the operating oil pressures $p_{op.1}$, $p_{op.2}$, and $p_{op.3}$ obtained by the measurement and calculation of the apparatus were all far smaller than the overpressure alarm threshold $p_{th.1}$ and the quasi-overpressure early alarm threshold $p_{th.2}$, and the apparatus did not issue an alarm or early alarm signal and indicated that the oil pressure inside the body of the transformer was normal. When the transformer bursts an internal arc fault at a moment t=0 ms, the oil pressure at each point inside the transformer will rise rapidly due to the injection of fault energy. When t=10.68 ms, the operating oil pressure $p_{op.1}$ obtained by measurement and calculation of the apparatus is greater than the quasi-overpressure early alarm threshold $p_{th.2}$, and the apparatus can issue a quasi-overpressure early alarm. When t=12.95 ms, the operating oil pressure $p_{op.1}$ obtained by measurement and calculation of the apparatus was greater than the overpressure alarm threshold $p_{th.1}$, and the apparatus issued a transformer overpressure alarm.

Figure 7:
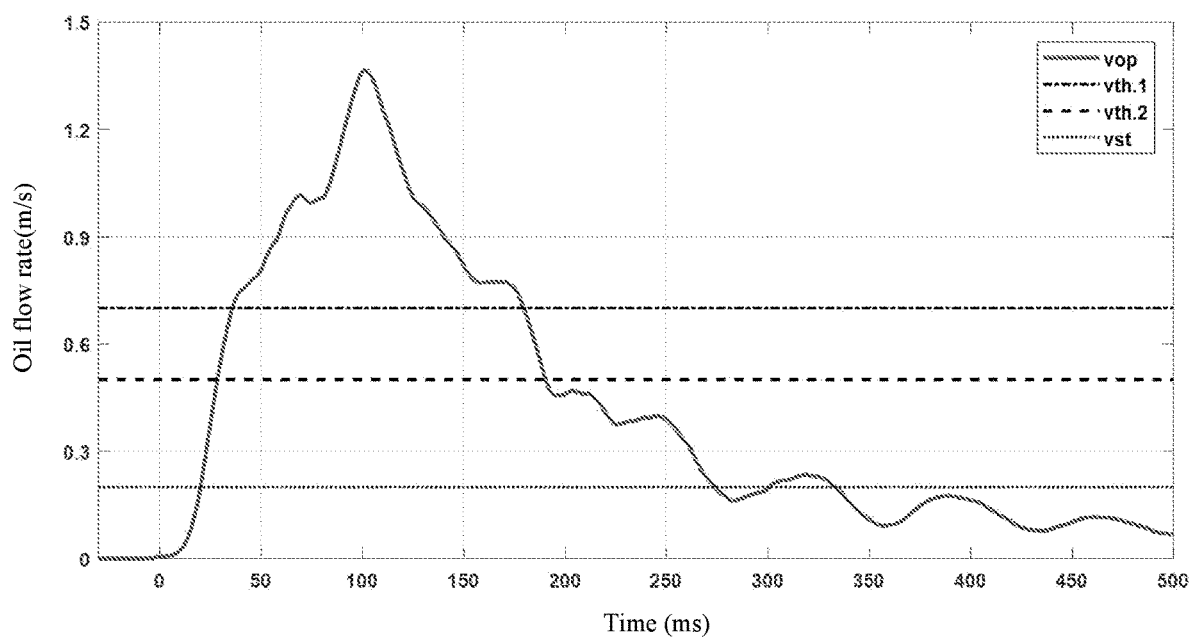
FIG. 7 shows a verification result of an oil flow characteristic monitoring test of a transformer on-line monitoring apparatus based on non-electricity comprehensive characteristic information.

As shown in FIG. 7, when the transformer normally operated (t<0 ms), the oil flow inside the oil conservator connecting pipe of the transformer did not significantly change, and at this time, the operating oil flow $v_{op}$ obtained by the measurement and calculation of the apparatus was smaller than the overflow alarm threshold $v_{th.1}$ and the quasi-overflow early alarm threshold $v_{th.2}$, and the apparatus did not issue an alarm or early alarm signal and indicated that the oil flow inside the transformer was normal. When the transformer bursted an internal electric arc fault at the time of t=0 ms, fault gas was generated due to the injection of fault energy, and the insulating oil inside the oil conservator connecting pipe flowed directionally. When t=28.9 ms, the operating oil flow $v_{op}$ obtained by measurement and calculation of the apparatus was greater than the quasi-overflow early alarm threshold $v_{th.2}$, and the apparatus issued a quasi-overflow early alarm. When t=36.21 ms, the operating oil flow $v_{op}$ obtained by the measuring and calculation of the apparatus was greater than the overflow alarm threshold $v_{th.1}$, and the apparatus issued an overflow alarm of the transformer.

The field test result shows that: the apparatus of the present disclosure can perceive and acquire the oil flow sudden change characteristic inside the oil conservator connecting pipe of the oil-immersed power transformer, the acceleration sudden change characteristic of the oil tank of the transformer, and the oil pressure change characteristic inside the transformer in a very short time period, obtain the operating oil flow capable of characterizing the surge intensity of the oil flow inside the transformer, the operating oil pressure characterizing the danger level of the oil pressure inside the transformer, and the operating acceleration characterizing the vibration intensity of the oil tank of the transformer through calculation, and evaluate the current running state and the safety level of the transformer through comparison with predetermined criteria, which provides important reference data and evaluation basis for field operators and transformer manufacturing enterprises.

The above is a further detailed description of the present disclosure with reference to specific preferred embodiments. It should be noted that the present disclosure is not limited to the specific embodiments described herein. It will be understood that those skilled in the art can make simple derivation or substitution within the scope of the present disclosure, and all these fall within the protection scope as defined by the appended claims.

What is claimed is:

1. A transformer monitoring apparatus based on non-electricity comprehensive characteristic information, comprising:
    a transient oil pressure characteristic measuring module;
    a transient oil flow characteristic measuring module;
    a transient acceleration characteristic measuring module;
    a signal conditioning and acquiring module; and
    a digital processing and analyzing module,
    wherein the transient oil pressure characteristic measuring module, the transient oil flow characteristic measuring module, and the transient acceleration characteristic measuring module are each connected to the signal conditioning and acquiring module, and the signal conditioning and acquiring module is connected to the digital processing and analyzing module;
    wherein the transient oil pressure characteristic measuring module is configured to measure internal oil pressure change characteristics of different positions of a transformer and output analog voltage/current signals corresponding to the internal oil pressure change characteristics;
    wherein the transient oil flow characteristic measuring module is configured to measure transient oil flow change characteristics in an oil conservator connecting pipe of the transformer at a high speed in real time and output analog voltage/current signals corresponding to the transient oil flow change characteristics;
    wherein the transient acceleration characteristic measuring module is configured to measure transient acceleration change characteristics of a body of the transformer and output analog voltage/current signals corresponding to the transient acceleration change characteristics;
    wherein the signal conditioning and acquiring module is configured to receive the analog voltage/current signals output by the transient oil pressure characteristic measuring module, the analog voltage/current signals output by the transient oil flow characteristic measuring module, and the analog voltage/current signals output by the transient acceleration characteristic measuring module, convert the analog voltage/current signals into standard digital signals identifiable by the digital processing and analyzing module, and output the standard digital signals; and
    wherein the digital processing and analyzing module is configured to execute a monitoring calculation after receiving the standard digital signals to finish a digital signal processing task and realize functions of on-line monitoring of a transient oil pressure in an oil tank, a transient oil flow in the oil conservator connecting pipe, and a transient acceleration of the body, and evaluation of a running state of the transformer.

2. The transformer monitoring apparatus based on non-electricity comprehensive characteristic information according to claim 1, wherein the transient oil pressure characteristic measuring module comprises a plurality of high-frequency dynamic oil pressure sensors and communication cables of the plurality of high-frequency dynamic oil pressure sensors; the plurality of high-frequency dynamic oil pressure sensors is arranged on the body of the transformer, and end probes of the plurality of high-frequency dynamic oil pressure sensors are in direct contact with an insulating oil of the transformer to measure the internal oil pressure change characteristics of the different positions of the transformer and output the analog voltage/current signals corresponding to the internal oil pressure change characteristics through the communication cables; and, wherein the plurality of high-frequency dynamic oil pressure sensors has a measuring frequency of 20 kHz, a measuring error smaller than 1%, a working temperature ranging from −45° C. to 120° C., and a measuring range of −0.1 MPa to 6 MPa.

3. The transformer monitoring apparatus based on non-electricity comprehensive characteristic information according to claim 1, wherein the transient oil flow characteristic measuring module comprises an external clip type high-frequency ultrasonic flowmeter, a flowmeter transmitter, and a communication cable, wherein the external clip type high-frequency ultrasonic flowmeter is connected to the flowmeter transmitter, the flowmeter transmitter is connected to the communication cable, and the external clip type high-frequency ultrasonic flowmeter is arranged on the oil conservator connecting pipe of the transformer and is arranged at 100 mm to 300 mm in front of a gas relay; and wherein the external clip type high-frequency ultrasonic flowmeter has a measuring frequency greater than or equal to 100 Hz, a measuring error smaller than 1%, a working temperature ranging from −30° C. to 80° C., and a flow speed range of −20 m/s to 20 m/s.

4. The transformer monitoring apparatus based on non-electricity comprehensive characteristic information according to claim 1, wherein the transient acceleration characteristic measuring module comprises a plurality of acceleration sensors, a transmitter, and a communication cable, wherein the plurality of acceleration sensors is strongly magnetically adsorbed on an outer wall of the body of the transformer and is connected to the transmitter, and the transmitter is connected to the communication cable; and wherein the plurality of acceleration sensors has a measuring frequency greater than or equal to 10 kHz, a measuring error smaller than 1%, a working temperature ranging from −40° C. to 80° C., and an acceleration range of −1000 g to 1000 g; and the signal conditioning and acquiring module comprises a connecting terminal, a signal conditioning circuit, a low-pass filter, a signal sampling circuit, and an analog-digital (A/D) conversion circuit, wherein the connecting terminal is connected to the signal conditioning circuit, the signal conditioning circuit is further connected to the low-pass filter, the low-pass filter is further connected to the signal sampling circuit, the signal sampling circuit is further connected to the A/D conversion circuit, and the connecting terminal is further connected to the transient oil pressure characteristic measuring module, the transient oil flow characteristic measuring module, and the transient acceleration characteristic measuring module.

5. The transformer monitoring apparatus based on non-electricity comprehensive characteristic information according to claim 1, wherein the digital processing and analyzing module comprises a bus, a central processing unit, a GPS synchronous clock, a random access memory, a read-only memory, and a control circuit, wherein the central processing unit, the GPS synchronous clock, the random access memory, and the control circuit are all connected to the bus; the A/D conversion circuit is connected to the bus; the bus comprises a data bus, an address bus, and a control bus and is configured to enable a data exchange and an operation control; the central processing unit is a single chip microprocessor, a general microprocessor, or a digital signal processor and is configured to enable a real-time digital signal processing; the GPS synchronous clock is configured to meet a synchronous sampling requirement of respective station devices in a transformer substation and a system; the random access memory is configured to temporarily store temporary data; the read-only memory is configured to store data; and the control circuit is configured to enable connection and coordination operation of a whole digital circuit by using a field programmable gate array.

6. The transformer monitoring apparatus based on non-electricity comprehensive characteristic information according to claim 1, further comprising:
a data storage module configured to store data;
a man-machine conversation module configured to establish information linkage between a digital protection device and a user to facilitate manual operations and debugging of the protection device by the operator and obtaining of information feedback; and
a data communication interface module configured to realize information interaction, data transmission, remote operation, and remote maintenance with other devices and a master station through Ethernet,
wherein the data storage module, the man-machine conversation module, and the data communication interface module are connected to the digital processing and analyzing module.

7. The transformer monitoring apparatus based on non-electricity comprehensive characteristic information according to claim 6, wherein the man-machine conversation module comprises a compact keyboard, a display screen, an indicator light, buttons, and a printer interface;
the data storage module is composed of a main flash memory and an auxiliary flash memory; the main flash memory serves as a main memory, and the auxiliary flash memory serves as a backup memory; and
the data communication interface module follows an IEC 61850 communication protocol, and is configured to realize information interaction, data transmission, remote operation, and remote maintenance with other devices and a master station through Ethernet.

8. A monitoring method using the transformer monitoring apparatus based on the non-electricity comprehensive characteristic information according to claim 1, comprising:
performing measurement, recording, calculation, and analysis for a transient oil pressure, an oil flow, and an acceleration of the body of the transformer respectively to realize real-time monitoring and reliable evaluation of a running state of the transformer,
wherein said performing measurement, recording, calculation and analysis for the transient oil pressure comprises:
step 1 of measuring, by the transient oil pressure characteristic measuring module, the oil pressure change characteristics of different positions in the transformer, i.e., reading oil pressures $p_{ms,n}(t)$ of n measuring points in the transformer at a current moment t, where n is 1, 2, 3 . . . , outputting the analog voltage/current signals corresponding to the oil pressure change characteristics; receiving, by the signal conditioning and acquiring module, the analog voltage/current signals output by the transient oil pressure characteristic measuring module, converting the analog voltage/current signals into standard digital signals identifiable by the digital processing and analyzing module, and outputting the standard digital signals;

step 2 of comparing, by the digital processing and analyzing module, a transient oil pressure $p_{ms.n}(t)$ of each of the n measuring points with a predetermined starting threshold $p_{st}$ after receiving the standard digital signals, entering step 3 when the transient oil pressure $p_{ms.n}(t)$ of any one of the n measuring points is greater than or equal to the predetermined starting threshold $p_{st}$, i.e., when a formula (1) is satisfied, and indicating that an oil pressure in the transformer is normal and entering step 5 when the oil pressure $p_{ms.n}(t)$ of each of the n measuring points is smaller than the predetermined starting threshold $p_{st}$, i.e., when the formula (1) is not satisfied, $$p_{ms.n}(t)-p_{st} \geq 0 \quad (1);$$

step 3 of calculating an operating oil pressure $p_{op.n}(t)$ of each of the n measuring points at a moment t through the following formula:

$$p_{op.n}(t) = \frac{1}{T \cdot f} \int_{t-T}^{t} p_{ms.n}(t) dt, \quad (2)$$

where T represents a length of a data window, and f represents a signal sampling frequency of an acquisition module;

comparing the operating oil pressure $p_{op.n}(t)$ with an overpressure alarm threshold $p_{th.1}$, issuing an overpressure alarm inside the transformer and entering step 5 when the operating oil pressure $p_{op.n}(t)$ is greater than or equal to the overpressure alarm threshold $p_{th.1}$, i.e., when a formula (3) is satisfied; and entering step 4 when the operating oil pressure $p_{op.n}(t)$ is smaller than the overpressure alarm threshold, i.e., when the formula (3) is not satisfied, $$p_{op.n}(t)-p_{th.1} \geq 0 \quad (3);$$

step 4 of comparing the operating oil pressure $p_{op.n}(t)$ with a quasi-overpressure early alarm threshold $p_{th.2}$; issuing a quasi-overpressure early alarm inside the oil tank and entering step 5 when the $p_{op.n}(t)$ is greater than or equal to the quasi-overpressure early alarm threshold $p_{th.2}$, i.e., when a formula (4) is satisfied; and indicating that the oil pressure in the transformer is normal when the $p_{op.n}(t)$ is smaller than the quasi-overpressure early alarm threshold $p_{th.2}$, i.e., when the formula (4) is not satisfied, $$p_{op.n}(t)-p_{th.2} \geq 0 \quad (4);$$

step 5 of storing measured oil pressure data and communicating the oil pressure data to a master station; and step 6 of performing self-checking in the running state; when a fault of the apparatus is found, issuing an alarm signal, locking the whole apparatus, and waiting for a technical personnel for removing the fault and manually resetting; and when no fault of the apparatus is found, returning to step 1, and re-reading an oil pressure $p_{ms.n}(t+1)$ at a next moment;

wherein said performing measurement, recording, calculation and analysis for the transient oil flow comprises:

step A of measuring, by the transient oil flow characteristic measuring module, transient oil flow change characteristics in the oil conservator connecting pipe of the transformer at a high speed in real time, and outputting analog voltage/current signals corresponding to the transient oil flow change characteristics; and receiving, by the signal conditioning and acquiring module, the analog voltage/current signals output by the transient oil flow characteristic measuring module, converting the analog voltage/current signals into standard digital signals identifiable by the digital processing and analyzing module, and outputting the standard digital signals;

step B of comparing, by the digital processing and analyzing module, a transient oil flow rate $v_{ms}(t)$ with a predetermined starting threshold $v_{st}$ after receiving the standard digital signals; entering step C when the transient oil flow rate $v_{ms}(t)$ is greater than or equal to a predetermined starting threshold $v_{st}$, i.e., when a formula (a) is satisfied; and indicating that an oil flow of the transformer is normal and entering step E when the $v_{ms}(t)$ is smaller than the predetermined starting threshold $v_{st}$, i.e., when the formula (a) is not satisfied, $$v_{ms}(t)-v_{st} \geq 0 \quad (a);$$

step C of calculating an operating oil flow $v_{op}(t)$ at a moment t using the following formula:

$$v_{op}(t) = \frac{1}{T \cdot f} \int_{t-T}^{t} v_{ms}(t) dt, \quad (b)$$

where T represents a length of a data window, and f represents a signal sampling frequency of an acquisition module; and comparing the operating oil flow $v_{op}(t)$ with an overflow alarm threshold $v_{th.1}$; issuing an overflow alarm of the transformer and entering step E when the operating oil flow $v_{op}(t)$ is greater than or equal to the overflow alarm threshold $v_{th.1}$, i.e., when a formula (c) is satisfied;

and entering step D when the operating oil flow $v_{op}(t)$ is smaller than the overflow alarm threshold $v_{th.1}$, i.e., when the formula (c) is not satisfied;

$$v_{op}(t)-v_{th.1} \geq 0 \quad (c);$$

step D of comparing the operating oil flow $v_{op}(t)$ with a quasi-overflow early alarm threshold $v_{th.2}$; issuing a quasi-overflow early alarm of the transformer, and entering step E when the operating oil flow is greater than or equal to the quasi-overflow early alarm threshold $v_{th.2}$, i.e., when a formula (d) is satisfied; and indicating that the oil flow in the transformer is normal when the operating oil flow is smaller than the quasi-overflow early alarm threshold $v_{th.2}$, i.e., when the formula (d) is not satisfied, $$v_{op}(t)-v_{th.2} \geq 0 \quad (d);$$

step E of storing measured oil flow data and communicating the oil flow data to the master station; and step F of performing self-checking in the running state; when a fault of the apparatus is found, issuing an alarm signal, locking the whole apparatus, and waiting for a technical personnel for removing the fault and manually resetting; and when no fault of the apparatus is found, returning to step A, and re-reading an oil flow rate $v_{ms}(t+1)$ at a next moment; and wherein said performing measurement, recording, calculation and analysis for the transient acceleration comprises:

step I of measuring, by the transient acceleration characteristic measuring module, the transient acceleration change characteristics of the body of the transformer, i.e., accelerations $a_{ms.n}(t)$ of n measuring points of the body of the transformer at a current moment t, where n is 1, 2, 3 . . . , and outputting the analog voltage/current signals corresponding to the transient acceleration change characteristics; and receiving, by the signal conditioning and acquiring module, the analog voltage/current signals output by the transient acceleration characteristic measuring module, converting the analog voltage/current signals into standard digital signals identifiable by the digital processing and analyzing module, and outputting the standard digital signals;

step II of comparing, by the digital processing and analyzing module, each of the accelerations $a_{ms.n}(t)$ of the n measuring points and a predetermined starting threshold $a_{st}$ after receiving the standard digital signals; entering step III when any one of the accelerations $a_{ms.n}(t)$ of the n measuring points is greater than or equal to the predetermined starting threshold $a_{st}$, i.e., when a formula (i) is satisfied; indicating that vibration in the transformer is normal and entering step V when all of the accelerations $a_{ms.n}(t)$ of the n measuring points are smaller than the predetermined starting threshold $a_{st}$, i.e., when the formula (i) is not satisfied, $$a_{ms.n}(t)-a_{st}\geq 0 \tag{i}$$

step III of calculating an operating oil acceleration $a_{op.n}(t)$ of each of the n measuring points at the moment t by the following formula:

$$a_{op.n}(t) = \left|\frac{1}{T\cdot f}\int_{t-T}^{t} a_{ms.n}(t)dt\right|, \tag{ii}$$

where T represents a length of a data window, and f represents a signal sampling frequency of an acquisition module; and comparing the operating acceleration $a_{op.n}(t)$ with an over-vibration alarm threshold $a_{th.1}$; issuing an over-vibration alarm of the transformer and entering step V when the operating acceleration $a_{op.n}(t)$ is greater than or equal to the over-vibration alarm threshold $a_{th.1}$, i.e., when a formula (iii) is satisfied; and entering step IV when the operating acceleration $a_{op.n}(t)$ is smaller than the over-vibration alarm threshold $a_{th.1}$, i.e., when the formula (11) is not satisfied, $$a_{op.n}(t)-a_{th.1}\geq 0 \tag{iii};$$

step IV of comparing the operating acceleration $a_{op.n}(t)$ with a quasi-over-vibration early alarm threshold $a_{th.2}$; issuing a quasi-over-vibration early alarm of the transformer and entering step V when the $a_{op.n}(t)$ is greater than or equal to the quasi-over-vibration early alarm threshold $a_{th.2}$, i.e., when a formula (iv) is satisfied; and indicating that the vibration in the transformer is normal when the $a_{op.n}(t)$ is smaller than the quasi-over-vibration early alarm threshold $a_{th.2}$, i.e., the formula (iv) is not satisfied, $$a_{op.n}(t)-a_{th.2}\geq 0 \tag{iv};$$

step V of storing measured acceleration data and communicating the acceleration data to the master station; and step VI of performing self-checking in the running state; when a fault of the apparatus is found, issuing an alarm signal, locking the whole apparatus, and waiting for a technical personnel for removing the fault and manually resetting; and when no fault of the apparatus is found, returning to step I and re-reading accelerations $a_{ms.n}(t+1)$ at a next moment.

9. The monitoring method according to claim 8, wherein in step 2, the predetermined starting threshold $p_{st}$ is set to 35 kPa; in step 3, the length T of the data window is $5\times10^{-3}$ s, and the overpressure alarm threshold $p_{th.1}$ is 70 kPa; and in step 4, the quasi-overpressure early alarm threshold $p_{th.2}$ is 55 kPa.

10. The monitoring method according to claim 8, wherein in step B, the predetermined starting threshold $v_{st}$ ranging from 0.2 m/s to 0.4 m/s; in step C, the overflow alarm threshold $v_{th.1}$ is set to 0.7 m/s; in step C, the length T of the data window is 0.02 s; and in step D, the quasi-overflow early alarm threshold $v_{th.2}$ is 0.5 m/s; and in step II, the predetermined starting threshold $a_{st}$ is set to 2.5 g; in step III, the length T of the data window is $1\times10^{-3}$ s, and the over-vibration alarm threshold $a_{th.1}$ is 20 g; and in the step IV, the quasi-over-vibration early alarm threshold $a_{th.2}$ is 10 g.

* * * * *